(12) United States Patent
Costa et al.

(10) Patent No.: US 12,352,811 B1
(45) Date of Patent: Jul. 8, 2025

(54) VALIDATING TEST PATTERNS PORTED BETWEEN DIFFERENT LEVELS OF A HIERARCHICAL DESIGN OF AN INTEGRATED CIRCUIT

(71) Applicant: Synopsys, Inc., Sunnyvale, CA (US)

(72) Inventors: Andrea Costa, Delta (CA); Frederic Jean Neuveux, Grenoble (FR); Salvatore Talluto, Gavirate (IT); Sorin Ioan Popa, Saint-Ismier (FR); Leela Krishna Thota, Bangalore (IN)

(73) Assignee: Synopsys, Inc., Sunnyvale, CA (US)

(*) Notice: Subject to any disclaimer, the term of this patent is extended or adjusted under 35 U.S.C. 154(b) by 208 days.

(21) Appl. No.: 18/345,962

(22) Filed: Jun. 30, 2023

(51) Int. Cl.
*G01R 31/28* (2006.01)
*G01R 31/317* (2006.01)
*G01R 31/3181* (2006.01)

(52) U.S. Cl.
CPC ... *G01R 31/2884* (2013.01); *G01R 31/31704* (2013.01); *G01R 31/31813* (2013.01)

(58) Field of Classification Search
CPC .......... G01R 31/2884; G01R 31/31704; G01R 31/31813

USPC .................. 324/762.01, 537, 500
See application file for complete search history.

(56) References Cited

U.S. PATENT DOCUMENTS

| | | | | |
|---|---|---|---|---|
| 12,135,351 | B2* | 11/2024 | Colombo | H03M 1/108 |
| 2016/0259002 | A1* | 9/2016 | Lambert | G01R 31/31908 |
| 2018/0284192 | A1* | 10/2018 | Kumar | G06F 11/25 |

* cited by examiner

*Primary Examiner* — Giovanni Astacio-Oquendo
(74) *Attorney, Agent, or Firm* — Fenwick & West LLP (57) ABSTRACT

A block of circuitry contains at least one sub-block. Test patterns for the sub-block (sub-level test patterns) include sub-level test stimuli and corresponding sub-level test responses. These are ported to the block-level to produce block-level test patterns, block-level test stimuli, and block-level test responses. The block-level test patterns are validated as follows. Propagation of the block-level test stimuli through the block-level design is computed. The signals produced by such computed propagation at the sub-block inputs are compared against the sub-level test stimuli, and the signals produced by such computed propagation at the block outputs are compared against the block-level test responses.

20 Claims, 11 Drawing Sheets

600 {
- SVM CLUSTER_1: Run-time setting - pattern report = 1
- SVM CLUSTER_1: Running Scalable Verification Model for instance top_test.dut.U_CORE0 generated from STIL (Standard Test Interface Language) file "cluster_1.stil"
- 603 SVM CLUSTER_1: Reading test data file "xtb_svm_CLUSTER_1.dat"
- 604 SVM CLUSTER_1: input check: ON - clock check: ON - output check: OFF - output force: ON
- 605 SVM CLUSTER_1: Using black box for module "CORE_2_2_1" (instance "top_test.dut.U_CORE0")

610 {
- 611 XTB: Reading test data file "xtb.dat"
- XTB: Total number of patterns 4
- XTB: Starting serial simulation of 4 patterns

XTB: Begin serial scan load for pattern 0 (T=200.00 ns, V=3)
XTB: Begin serial scan load for pattern 1 (T=20300.00 ns, V=204)
SVM CLUSTER_1: Begin validation of pattern 0 (T=20300.00 ns, V=204)

630 {
- ==> Error on top_test.dut.U_CORE0 during load_unloadStmt pattern 1
- ==>     At T=20355.00 ns, V=204, exp=0, got=P, pin top_test.dut.U_CORE0.wrp_clock
- ==>     At T=23345.00 ns, V=234, exp=1, got=0, pin top_test.dut.U_CORE0.test_si3
- ...
- ==>     At T=23445.00 ns, V=235, exp=1, got=0, pin top_test.dut.U_CORE0.test_si6

SVM CLUSTER_1: Begin validation of pattern 1 (T=41355.00 ns, V=414)
XTB: Begin serial scan load for pattern 2 (T=41400.00 ns, V=415)

630 {
- ==> Error on top_test.dut.U_CORE0 during load_unloadStmt pattern 2
- ==>     At T=44445.00 ns, V=445, exp=1, got=0, pin top_test.dut.U_CORE0.occ_si
- ...
- ==>     At T=44545.00 ns, V=446, exp=1, got=0, pin top_test.dut.U_CORE0.test_si6

SVM CLUSTER_1: Begin validation of pattern 2 (T=62455.00 ns, V=625)
XTB: Begin serial scan load for pattern 3 (T=62500.00 ns, V=626)

630 {
- ==> Error on top_test.dut.U_CORE0 during load_unloadStmt pattern 3
- ==>     At T=65545.00 ns, V=656, exp=1, got=0, pin top_test.dut.U_CORE0.occ_si
- ...
- ==>     At T=65645.00 ns, V=657, exp=1, got=0, pin top_test.dut.U_CORE0.test_si6

620 {
- >>> Error during scan pattern 3 (detected from unload of pattern 2)
- >>>     At T=65740.00 ns, V=658, exp=0, got=z, pin top_so7
- >>>     At T=65740.00 ns, V=658, exp=0, got=z, pin top_so6
- ...
- >>>     At T=65840.00 ns, V=659, exp=1, got=z, pin top_so1

SVM CLUSTER_1: Begin validation of pattern 3 (T=83555.00 ns, V=836)
640 XTB: Simulation of 4 patterns completed with 14 mismatches (time: 83600.00 ns, cycles: 836)

645 {
- SVM CLUSTER_1: Verification of 3 patterns completed with 23 errors
- SVM CLUSTER_1: input errors = 22
- SVM CLUSTER_1: clock error = 1

VALIDATING TEST PATTERNS PORTED BETWEEN DIFFERENT LEVELS OF A HIERARCHICAL DESIGN OF AN INTEGRATED CIRCUIT

TECHNICAL FIELD

The present disclosure relates to testing of electronic circuits. In particular, the present disclosure relates to validating test patterns used for such testing.

BACKGROUND

As technology nodes shrink and the complexity and gate count of devices increase, the design and testing of integrated circuits becomes increasingly important and increasingly complex. Complex integrated circuits may be designed using a hierarchical approach. An integrated circuit may be divided into different components, which are subdivided into sub-components, etc. Each component may be designed and validated separately from the other components, and then the full design generated from the previously validated components.

However, testing of the manufactured integrated circuit is performed through the input/output (I/O) pins of the integrated circuit. The inputs and outputs to components within the integrated circuit may not be directly accessible during testing, even though much of the design may occur at the component level during the development of the integrated circuit.

SUMMARY

In one aspect, a block of circuitry in a hierarchical design contains at least one sub-block. A block-level design for the block of circuitry is received. Test patterns for the sub-block (sub-level test patterns) are also received. The sub-level test patterns include (a) sub-level test stimuli which are applied to inputs of the sub-block (sub-block inputs), and (b) sub-level test responses which are expected at outputs of the sub-block (sub-block outputs) in response to the sub-level test stimuli. Test patterns for the block (block-level test patterns) are also received. These include (x) block-level test stimuli, which are the sub-level test stimuli ported to inputs of the block of circuitry (block inputs), and (y) block-level test responses, which are the sub-level test responses ported to outputs of the block of circuitry (block outputs). The block-level test patterns are validated as follows. Propagation of the block-level test stimuli through the block-level design is computed. The signals produced by such computed propagation at the sub-block inputs are compared against the sub-level test stimuli, and the signals produced by such computed propagation at the block outputs are compared against the block-level test responses.

In another aspect, a block-level design, sub-level test stimuli, and block-level test stimuli are received. The block-level test stimuli are validated as follows. Propagation of the block-level test stimuli from the block inputs to the sub-block inputs is computed using the block-level design. The block-level test stimuli propagated to the sub-block inputs are compared against the sub-level test stimuli.

In yet another aspect, a block-level design, sub-level test responses, and block-level test responses are received. The block-level test responses are validated as follows. Propagation of the sub-level test responses from the sub-block outputs to the block outputs is computed using the block-level design. The sub-level test responses propagated to the block outputs are compared against the block-level test responses.

Other aspects include components, devices, systems, improvements, methods, processes, applications, computer readable mediums, and other technologies related to any of the above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to validating test patterns ported between different levels of a hierarchical design of an integrated circuit. A hierarchical circuit design may contain multiple levels of hierarchy, in which blocks of circuitry may contain one or more sub-blocks at a lower level of hierarchy. Design of the circuit, including developing test patterns to test the manufactured circuit, may occur at the sub-block level (referred to as the sub-level). As the circuit design progresses up the hierarchy, developments at the sub-level may be ported to the block-level until reaching the top-level design of the hierarchy.

With respect to test patterns, a test pattern may include a test stimulus (input signals applied to a circuit) and a corresponding test response (the expected output signals). For a hierarchical design, test patterns may be developed for testing the sub-block. These sub-level test stimuli will be applied to the inputs of the sub-block (sub-block inputs), with the corresponding sub-level test responses expected at the outputs of the sub-block (sub-block outputs). As part of the development process, these sub-level test patterns may be validated to ensure that they are correct. The validated sub-level test patterns may then be ported to the block-level to generate corresponding block-level test patterns. These block-level test patterns, if ported correctly, may be used to test the sub-block but by applying test stimulus at the block inputs and observing the responses at the block outputs, rather than at the sub-block inputs and outputs which may not be accessible during testing of the manufactured circuit.

The block-level test patterns generated by porting the previously validated sub-level test patterns may be validated as follows. On the input side, the block-level test stimulus may be propagated through the block-level design from the block inputs to the sub-block inputs. These can then be compared against the known, validated sub-block test stimulus to determine whether the test stimulus was ported properly.

Analogously, on the output side, the known, validated sub-block test response may be propagated through the block-level design from the sub-block outputs to the block outputs. These can then be compared against the block-level test response to determine whether the test response was ported properly.

Propagation of signals through the sub-block may be accomplished using a netlist of the sub-block. Alternatively, since the test stimulus/response pairs for the sub-block have been validated and are known to be correct, a model based on those stimulus/response pairs may be used instead.

Technical advantages of the present disclosure include, but are not limited to, the following. Use of a model of the sub-block, rather than re-simulating propagation through the sub-block, can increase performance by reducing the runtime of the processing device and memory requirements. Since the test stimulus/response pairs for the sub-block are known, the sub-block may be modeled by forcing the sub-block outputs to the desired test response when the corresponding test stimulus is received at the sub-block inputs. This is faster than propagating the test stimulus through the netlist of the sub-block, thus reducing the runtime. In addition, the model that matches test stimuli with their corresponding test responses is smaller than the design of the sub-block, thus reducing memory requirements.

Another advantage is that this approach may be used with an RTL (register transfer level) design of the block, in addition to a gate-level netlist of the block. This allows the validation of the block-level test patterns and the design itself, even before the gate-level netlist for the block has been finalized. This approach may also be synchronized using the clock edges within the sub-block, so that it is independent of the clock frequency at the block-level.

Yet another advantage is that the validation of the block-level test patterns, errors in the block-level design outside of the sub-block, and verification of constraints and clock propagation are simplified.

Figure 1:
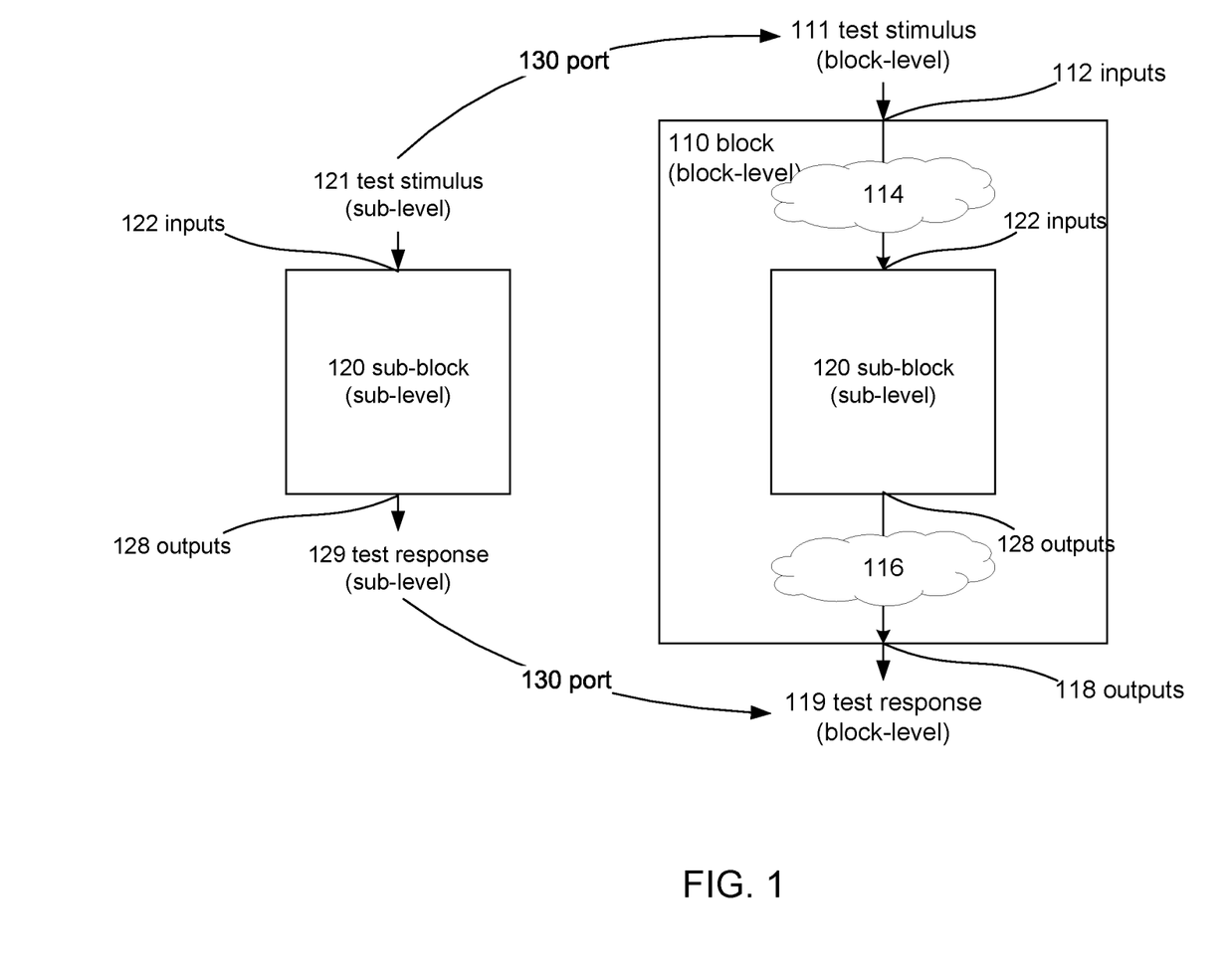
FIG. 1 is a diagram of a development of test patterns for a block of circuitry that contains a sub-block of circuitry, in accordance with some embodiments of the present disclosure.

FIG. 1 is a diagram of a development of test patterns for a block of circuitry that contains a sub-block of circuitry, in accordance with some embodiments of the present disclosure. As shown on the righthand side of FIG. 1, a hierarchical design may contain multiple layers of designs. The design for a block 110 of circuitry may contain the design for a sub-block 120 of circuitry. The following example will use one block and one sub-block, but the principles illustrated apply to multiple blocks and sub-blocks, and multiple layers of hierarchy. Blocks at one level of the hierarchy may be sub-blocks at another level of the hierarchy.

In some cases, the block 110 is the top-level block for the integrated circuit. For example, it may represent the top-level design of a system-on-chip (SoC). The sub-blocks 120 are cores or macros contained within the integrated circuit. For example, they may be processors, I/O interfaces, or other types of common circuits. These cores may be provided by third parties. It is not uncommon for a company to design the top-level SoC but license various cores from third parties. Accordingly, the third party may provide less design information about the core and/or less access to the interior of the core.

The lefthand side of FIG. 1 shows test development for the sub-block 120. The sub-block 120 has inputs 122 and outputs 128. In automatic test pattern generation (ATPG), test patterns are generated to test the functioning of the sub-block 120. These test patterns include test stimuli 121 which are applied to the sub-level inputs 122, and test responses 129 which should include the expected results produced at the sub-level outputs 128 if the sub-block 120 is operating correctly. A validation process may be used to determine whether the test stimuli 121 and test responses 129 are correct. The validation process may include simulation of the operation of the sub-block 120.

The sub-level test patterns 121, 129 are then ported 130 to the block level. The sub-level test stimuli 121 are ported 130 to produce corresponding block-level test stimuli 111. Analogously, the sub-level test responses 129 are ported 130 to produce corresponding block-level test responses 119. The block-level test patterns 111, 119 are the test patterns at the block-level that may be used to test the sub-block 120. In one approach to porting 130, behavioral models of the intervening circuitry 114, 116 are used to determine relationships between the block-level test stimuli 111 and test responses 119 and the sub-level test stimuli 121 and test responses 129. If the intervening circuitry 114, 116 is configurable, the porting process 130 can generate multiple different block-level test patterns depending on the configuration of the intervening circuitry 114, 116.

If ported correctly, the following should happen. A block-level test stimulus 111 is applied to block inputs 112. The signals propagate through any intervening circuitry 114 to reach the sub-block inputs 122. When they reach sub-block inputs 122, they should be the same as the sub-level test stimulus 121. If the test patterns 121, 129 have already been validated at the sub-block level, it is known that sub-level test stimulus 121 will produce sub-level test response 129 at the sub-block outputs 128. This is propagated through intervening circuitry 116 to reach the block outputs 118. When they reach outputs 118, they should be the same as the block-level test response 119.

Figure 2:
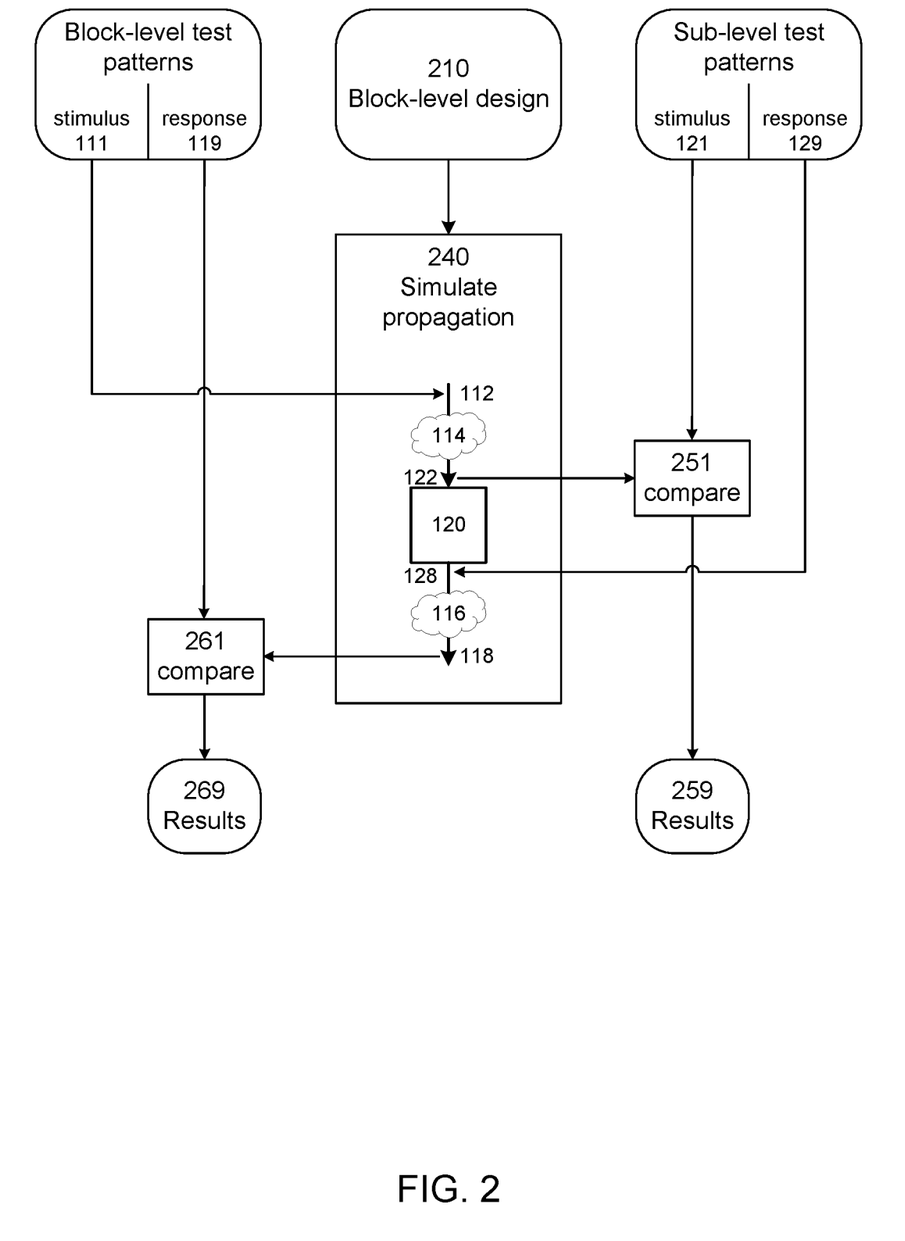
FIG. 2 is a flow diagram for validating test patterns ported from the sub-block level to the block-level, in accordance with some embodiments of the present disclosure.

FIG. 2 is a flow diagram for validating test patterns ported from the sub-block level to the block-level, in accordance with some embodiments of the present disclosure. The design of the block is captured by a block-level design 210. This may be a gate-level netlist or an RTL design. As described in more detail below, the block-level design may or may not include a design of the sub-block. Other inputs to the process of FIG. 2 are the validated sub-level test patterns having stimulus 121 with corresponding response 129, and the ported block-level test patterns having stimulus 111 with corresponding response 119. The test patterns have been ported to the block-level, and the process of FIG. 2 validates whether these block-level patterns 111,119 are correct.

At 240, the block-level test patterns are validated by computing propagation of the block-level test stimuli 111 through the block-level design 210. Propagation of signals through the design may be computed by simulating operation of the block using the design. The propagation 240 is represented in FIG. 2 by the diagram of the block from FIG. 1. At the input side, the block-level test stimuli 111 are applied to the block inputs 112. Propagation through intervening circuitry 114 is simulated using the design 210. If the test patterns have been ported correctly, the signals produced at the inputs 122 to the sub-block 120 should be the same as the validated sub-level test stimuli 121. At 251, the signals at sub-block inputs 122 are compared to the validated sub-level test stimuli 121. The results 259 of this comparison may be presented in different ways, as described below.

At the output side, the validated sub-level test responses 129 are applied at the outputs 128 of the sub-block 120. This effect may be achieved using different methods, as described in more detail below. Propagation through intervening circuitry 116 is simulated using the design 210. If the test patterns have been ported correctly, the signals produced at the block outputs 118 should be the same as the block-level test responses 119. At 261, the signals at block outputs 118 are compared to the block-level test responses 119. The results 269 of this comparison may also be presented in different ways, as described below.

Results 259 indicate whether the test stimuli have been ported correctly, and results 269 indicate whether the test responses have been ported correctly. These results may be presented in different ways. Results may include various reports, logs and/or displays. One form of report may list which test patterns have passed validation, failed validation (faults) or not yet undergone validation. A fault in a test pattern may be caused by an incorrectly ported block-level test pattern or may be the result of faults in the intervening circuitry. Another form of report may list which sub-blocks have passed validation, failed validation, or not yet undergone validation. The information about faults may be written to a file or displayed to the user. The form may be text, machine-readable, or some form of table or graphical representation. Logging mechanisms may capture more information beyond just the end result of whether a ported test pattern is faulty. For example, logs may capture information from the simulation 240, thus assisting the user to debug faults in the test patterns.

In addition to reporting for individual test patterns, summary or aggregate information may also be generated. Metrics, such as number or percentage of faulty test patterns, may be calculated. Summary information may also be graphically displayed, for example a heat map where different sub-blocks are color coded according to the number or percentage of faulty test patterns.

Failures can be the result of different causes, including the following: registers were not correctly initialized; block-level pins were not correctly constrained to the correct values; clocks were not pulsed correctly; the block-level behavior was not correct or was not represented accurately during the porting process; and/or the porting process was not correct. In some cases, automated debugging may trace faults back to the root cause or provide assistance to users in doing so.

The above description of FIG. 2 considered the validation of test stimuli and the validation of test responses as fairly independent processes. One could be done independent of the other. For example, in the process of debugging, there may be remaining faults only on the input side or only on the output side. Validations may be run only for the faulty side and only for the faulty test pattern(s) as part of the debugging process.

However, validation of both the input side and output side may also be run together. This may be done initially when validating both sides for all test patterns (or for all test patterns that still have faults). In addition, the simulation testbench for the block of circuitry may be set up to run a simulation of the entire block, including both the input side and output side.

Figure 3:
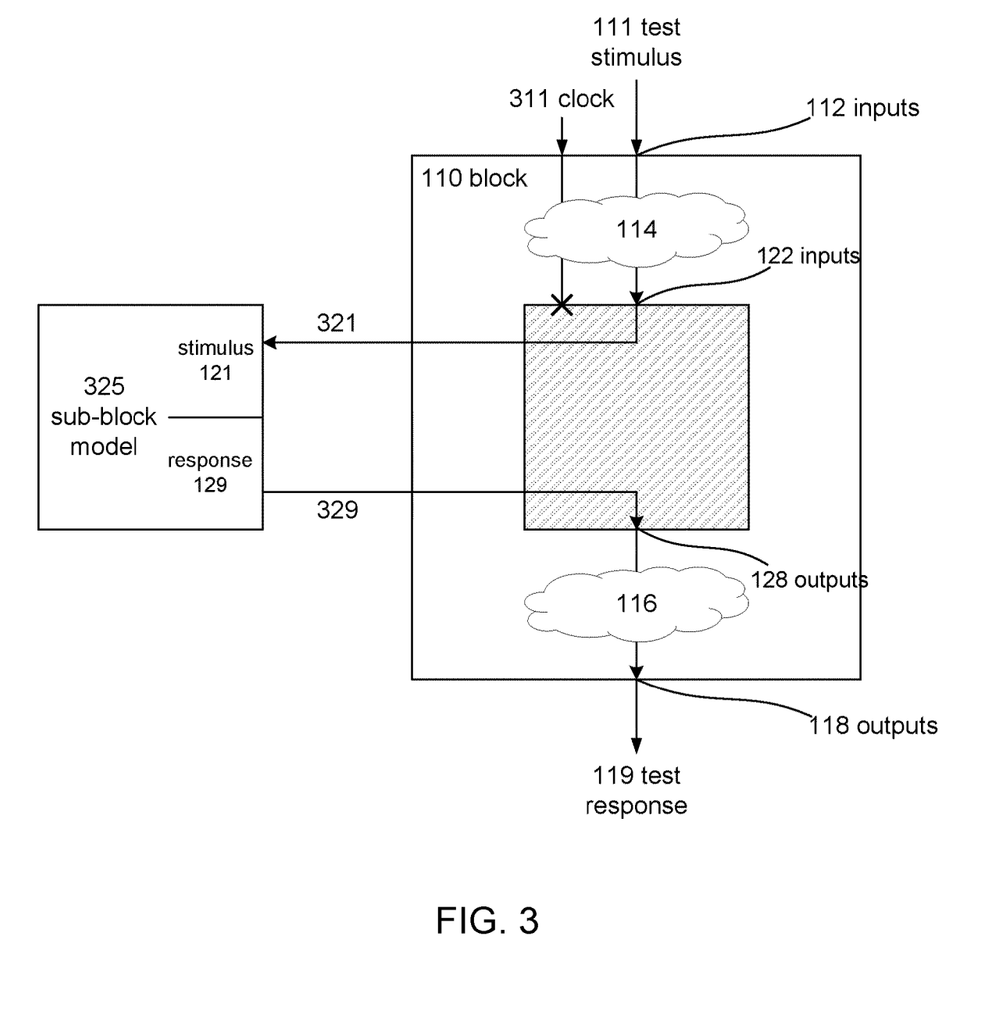
FIG. 3 is a diagram of a replacement mode for validating ported test patterns, in accordance with some embodiments of the present disclosure.
Figure 4:
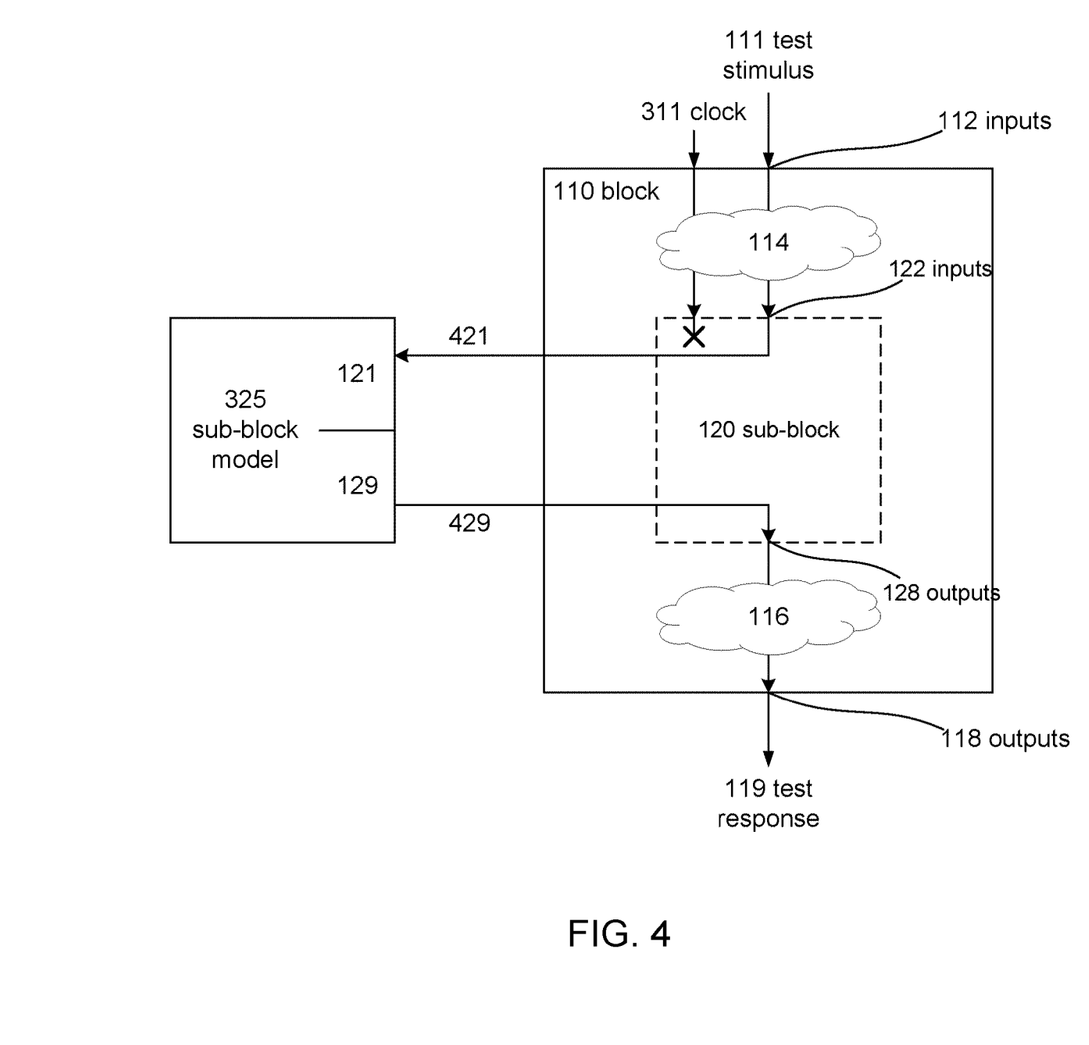
FIG. 4 is a diagram of a verification mode for validating ported test patterns, in accordance with some embodiments of the present disclosure.

FIGS. 3 and 4 show two different modes for handling the sub-block 120 in these situations. FIG. 3 is referred to as replacement mode, and FIG. 4 is referred to as verification mode. In these examples, the validated sub-level test patterns 121, 129 are captured in a sub-block model 325. The sub-block model 325 may be a data structure that matches sub-level test stimuli 121 with the corresponding sub-level test responses 129. The test stimulus 121 may be used as an index to determine the corresponding test response 129.

FIG. 3 is a diagram of a replacement mode for validating ported test patterns, in accordance with some embodiments of the present disclosure. In replacement mode, the sub-block 120 is replaced by the sub-block model 325. The netlist for the sub-block 120 need not be loaded into the simulator, as indicated by the cross-hatching in FIG. 3. Within the simulator, the sub-block may be represented by a black box module, which is a module that primarily contains an interface to the sub-block model 325. Alternatively, the sub-block may be represented by an RTL design containing only the testing functionality within the sub-block, rather than circuitry of the entire sub-block. The block-level testbench executes a simulation by applying block-level test stimuli 111 which are clocked by a block-level simulation clock 311. The simulation propagates these signals to the sub-block 120.

The signals received at the sub-block inputs 122 are checked against the sub-block model 325, as indicated by arrow 321. They may be used as an index matching against the sub-block test stimuli 121 stored in the model. When a test stimulus 121 is matched, the corresponding sub-block test response 129 is forced at the sub-block outputs 128, as indicated by arrow 329. The block-level testbench propagates these signals as part of the block-level simulation.

Timing of the simulation is handled as follows. A simulation clock 311 controlled by the block-level testbench is used to synchronize the simulation. Test stimuli 111 propagates from the block-level inputs to the sub-block according to this clock 311. Since the sub-block has been replaced, the simulation clock 311 does not propagate into the sub-block, as indicated by the x at the boundary of the sub-block. However, at the sub-block outputs 128, the sub-level test responses 129 are forced onto the outputs. The sub-block model 325 is synchronized not using the clock 311 but based on timing internal to the sub-block. This maintains timing with the block-level simulation at outputs 128 and through the intervening circuitry 116.

One advantage of replacement mode is that the netlist of the sub-block is not used and does not have to be loaded into the simulator. The sub-block model 325 is used instead, and the model can be significantly smaller than the netlist, for example 100 times smaller or even smaller. This saves memory space. Another advantage is that the simulator does not have to simulate the sub-block netlist, propagating signals through all the gates in the sub-block. Instead, the sub-block model 325 allows the lookup of incoming test stimuli 121. Because the sub-block 120 has been previously validated, it is known which test stimuli 121 produce which test responses 129. Accordingly, simulation of the sub-block may be replaced by setting the outputs 128 to the desired test responses 129. This can significantly reduce the runtime of the simulation. Note also that the block-level testbench runs the simulation. The testbench used to validate the sub-block is not needed.

Furthermore, because the netlist of the sub-block is not used, replacement mode may be used with either gate-level or RTL designs of the block. The use of RTL designs allows the validation of test patterns earlier in the design process, even before the gate-level designs are fully completed.

FIG. 4 is a diagram of a verification mode for validating ported test patterns, in accordance with some embodiments of the present disclosure. In verification mode, the netlist of the sub-block is loaded into the simulator, but the sub-block model 325 is used to shortcut a full simulation of the sub-block netlist. Verification mode does not provide as much acceleration as replacement mode, but it is still faster than a full simulation of the sub-block netlist. For example, replacement mode may not be feasible if the block-level design 110 is a flattened gate-level netlist without hierarchy, so that the boundary of the sub-block 120 is not apparent, as indicated by the dashed boundary in FIG. 4. In those situations, verification mode may be used.

In verification mode, the block-level testbench executes a simulation by applying block-level test stimuli 111 clocked by a block-level simulation clock 311. The simulation propagates these signals into the sub-block 120. The signals captured within the sub-block 120 are checked against the sub-block model 325, as indicated by arrow 421. When a test stimulus 121 is matched, the corresponding sub-block test response 129 is forced at the sub-block outputs 128, as indicated by arrow 429. The block-level testbench propagates these signals as part of the block-level simulation.

Timing in verification mode is handled as follows. Test stimuli 111 propagate from the block-level inputs to the sub-block according to the simulation clock 311, and the test responses 129 are forced onto the sub-block outputs 128 also consistent with the simulation clock 311. This maintains the overall timing for the block-level simulation. However, the simulation clock within the sub-block is blocked, as indicated by the x within sub-block 120. This effectively suspends simulation of the sub-block netlist, which in turn accelerates the runtime of the simulation.

Figure 5:
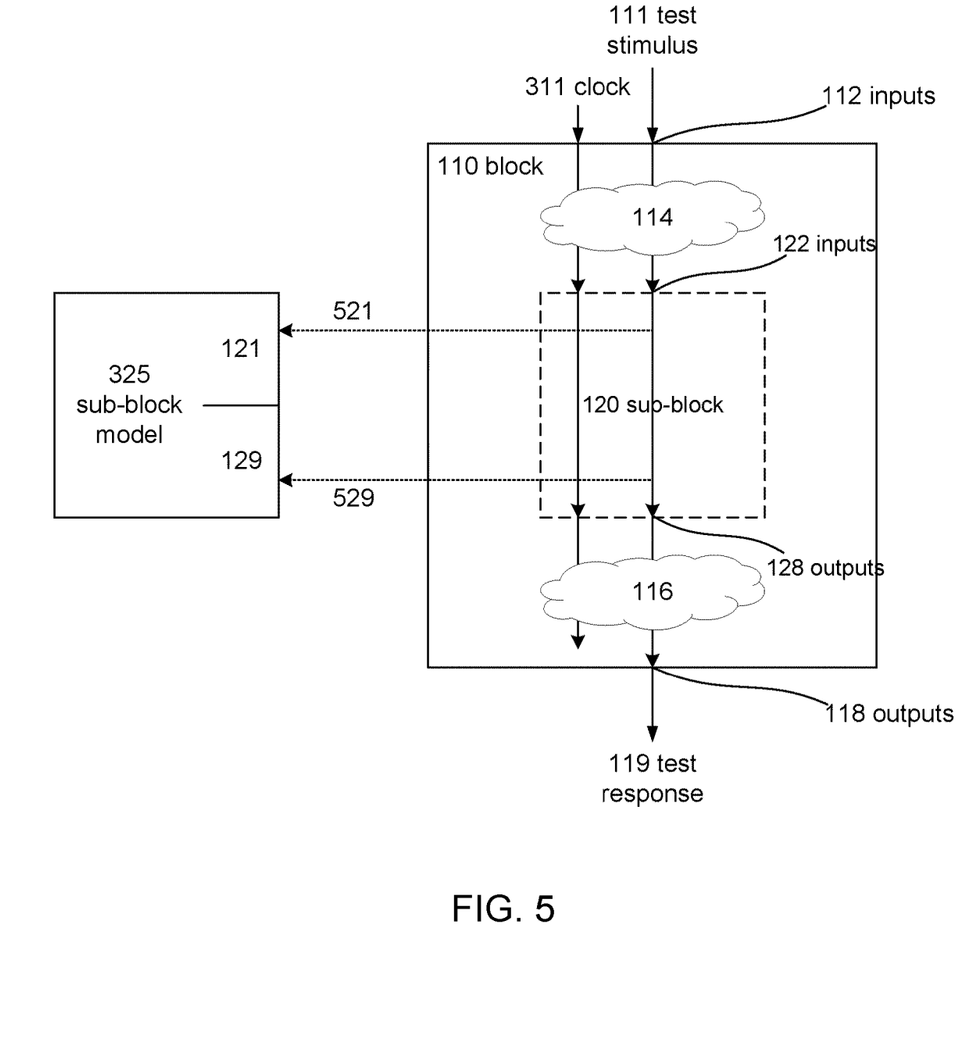
FIG. 5 is a diagram of a debug mode for validating ported test patterns, in accordance with some embodiments of the present disclosure.

Replacement mode and verification mode are two methods for identifying faults in ported test patterns. Once faulty test patterns are identified, the system allows a user to fix the faults. FIG. 5 is a diagram of a debug mode for validating ported test patterns, in accordance with some embodiments of the present disclosure. In debug mode, the block-level testbench performs a full simulation, including of the sub-block 120. Signal values from this simulation may be compared against expected test patterns from the sub-block model 325, as indicated by the dotted lines 521 and 529. The simulation may be a time-based simulation, as clocked by the simulation clock 311. The user may control time stepping through the time-based simulation in order to debug faults.

Figure 6A:
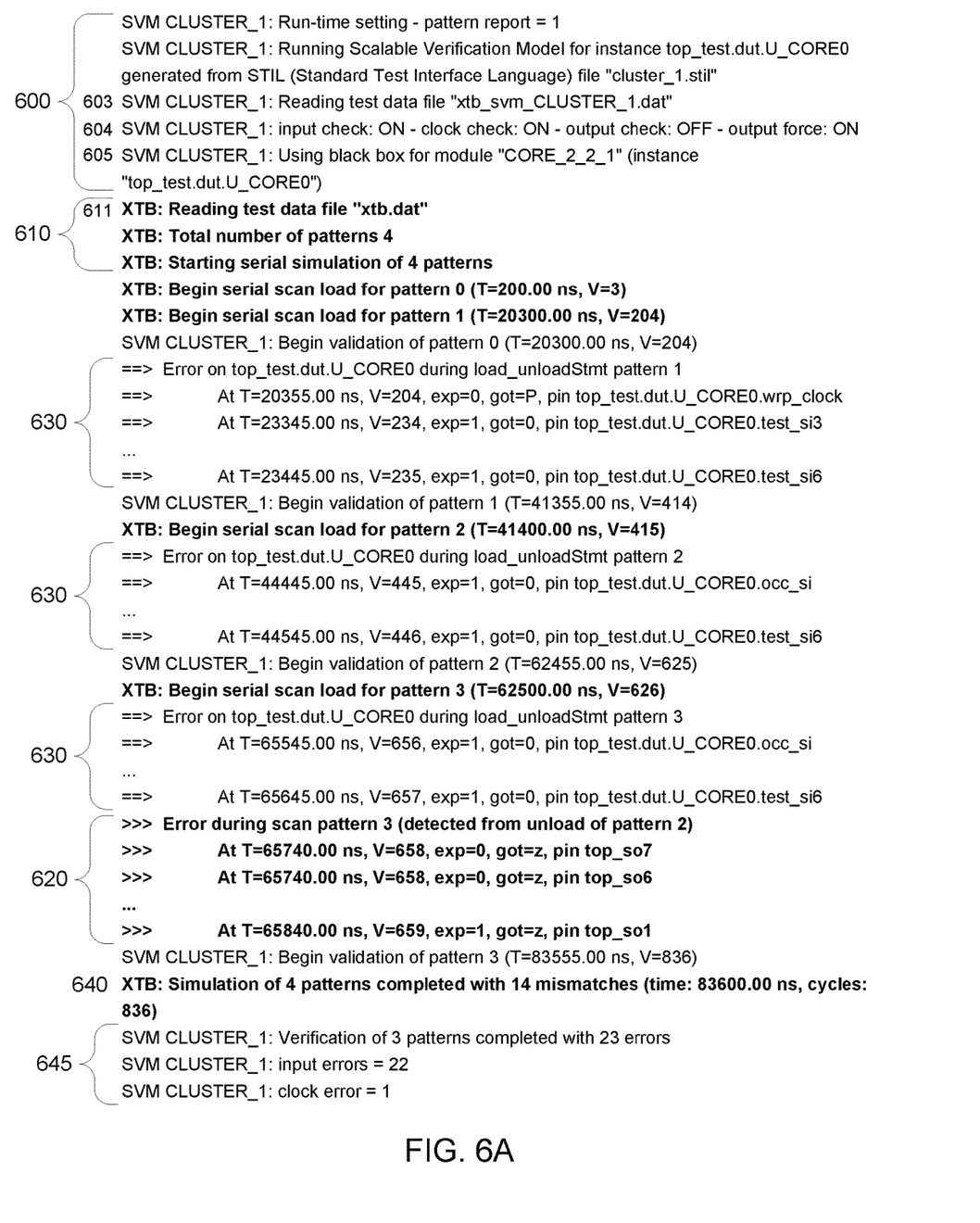
FIG. 6A is a listing that shows how a sub-block model can be used to report simulation mismatches at the boundary of the sub-block, in accordance with some embodiments of the present disclosure.

FIG. 6A is a listing that shows how a sub-block model can be used to report simulation mismatches at the boundary of the sub-block. In this example, XTB is the top-level testbench and lines relating to the testbench are boldfaced. SVM (scalable verification model) is the sub-block model of the sub-block CLUSTER_1 and lines for SVM are regular font (not boldfaced). Lines 600 show initialization of the sub-block model. Line 603 reads in the validated sub-block test patterns. Line 604 sets various configuration parameters. "input check: ON" means to validate the test stimuli, "clock check: ON" means to check the associated clocking, "output check: OFF" means not to validate the test responses, and "output force: ON" means to force the test responses onto the sub-block outputs. Line 605 means to use a black box replacement for the sub-block.

Lines 610 show initialization of the top-level simulation. Line 611 identifies the file with the top-level test patterns. In this case, four test patterns are evaluated. The XTB lines after lines 610 show the start of top-level simulations for scan patterns 0, 1, 2, and 3, respectively. Lines 620 report errors at the top-level. Lines 630 report errors at the sub-block level. Note that a mismatch of ported test stimuli may be reported as a sub-block error because the comparison of test stimuli occurs at the input to the sub-block, while a mismatch of ported test responses may be reported as a top-level error because the comparison of test responses occurs at the output to the block. Line 640 is a summary of errors at the top-level, and lines 645 are a summary of errors at the sub-block level.

Figure 6B:
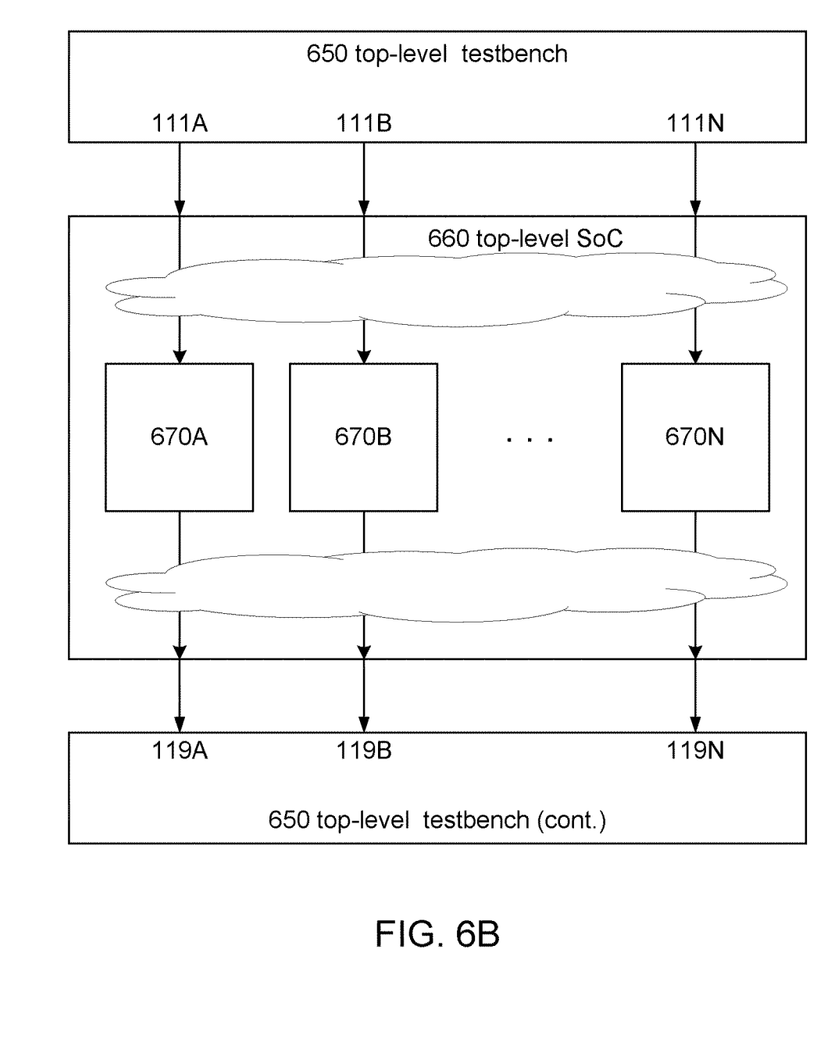
FIG. 6B is a diagram of a top-level testbench for validating ported test patterns, in accordance with some embodiments of the present disclosure.

FIG. 6B is a diagram of a top-level testbench for validating ported test patterns, in accordance with some embodiments of the present disclosure. Here, the block is a top-level design 660 of a system-on-chip (SoC). The SoC contains multiple cores 670A-N. Each core 670 may have its own set of previously validated test patterns, which have been ported to the top-level. In FIG. 6, the top-level simulation testbench 650 is used to validate the ported test stimuli 111A-N with corresponding test responses 119A-N for multiple cores 670A-N in parallel. The validations for different cores may be executed separately and independent of each other. They may also be executed in parallel, for example using different threads on multi-processing devices for different cores.

Figure 7A:
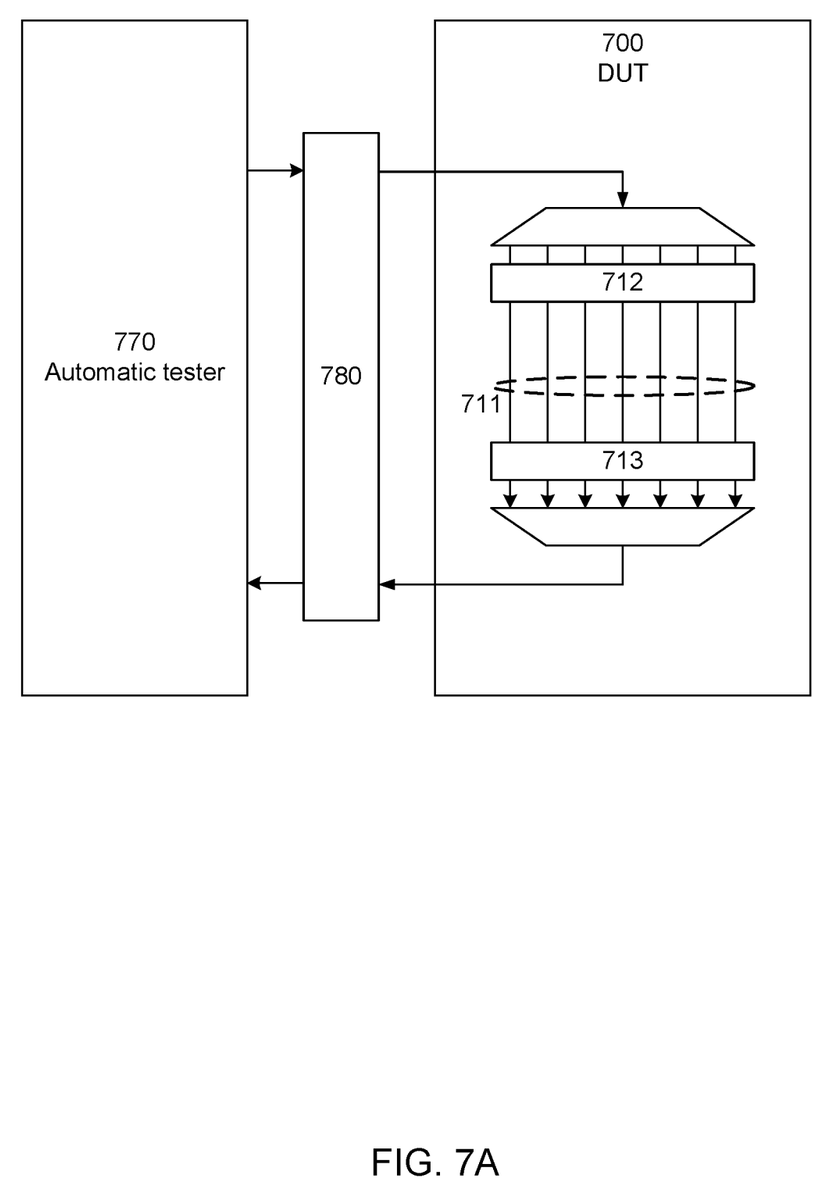
FIG. 7A is a block diagram of a testing system using top-level ported test patterns to test manufactured integrated circuits, in accordance with some embodiments of the present disclosure.
Figure 7B:
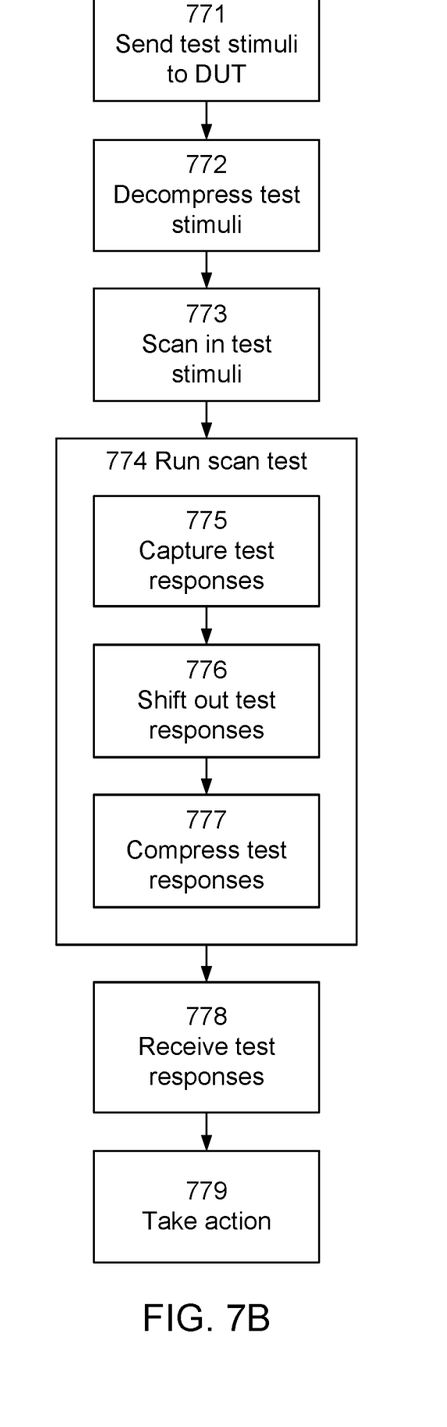
FIG. 7B is a flow diagram of operation of the testing system of FIG. 7A.

Once the validation process is completed and all faults resolved, the validated top-level test patterns may be used to test manufactured integrated circuits, as shown in FIGS. 7A and 7B. FIG. 7A is a block diagram of a testing system using top-level ported test patterns, in accordance with some embodiments of the present disclosure. FIG. 7B is a flow diagram of operation of the testing system of FIG. 7A. The testing system includes a device under test (DUT) 700 such as a manufactured SoC, an automatic tester 770, and a test interface 780 between the automatic tester 770 and the DUT 700. The automatic tester 770 runs scan tests on the DUT 700. These scan tests make use of scan chains 711. Data transmitted between the tester 770 and the DUT 700 may be compressed, so the DUT may include a data decompressor 712 and a data compressor 713.

Referring to FIG. 7B, the tester 770 runs scan tests as follows. At 771, the tester 770 sends test stimuli to the DUT, including top-level test stimuli that has been validated as described above for the testing of cores within the DUT. The validated top-level test stimuli include test stimuli for cores or other sub-blocks within the DUT. This data is used to set internal circuits to the initial states for the desired test. The test setup data is sent in compressed form to the DUT. At 772, the data decompressor 712 within the DUT decompresses the setup data and, at 773, it shifts the data into the relevant interior logic circuits via the scan chains 711.

At 774, the DUT then operates, moving forward from the initial state set by the tester 770. During the scan test 774, states of the DUT are captured. At 775, the corresponding responses to the test stimuli are captured into the corresponding scan chains. At 776, the respective test responses are shifted out via the scan chains 711. At 777, the data compressor 713 within the DUT may compress the data so that less bandwidth is required to transmit this data from the DUT off-chip and back to the tester.

At 778, the tester 770 receives the test responses. These top-level test responses include test responses for cores and other sub-blocks within the DUT. The data from different scan chains may be multiplexed in order to reduce the number of pins on the DUT 700. At 779, the tester 770 or other components may then take appropriate actions. For example, the test responses may be analyzed to detect faults in the DUT. Based on the analysis, different types of data or logs may be captured or probed in more detail. Subsequent tests may be selected and run based on the results of prior tests. Test results over many DUTs may be analyzed to identify root causes of failures.

Figure 8:
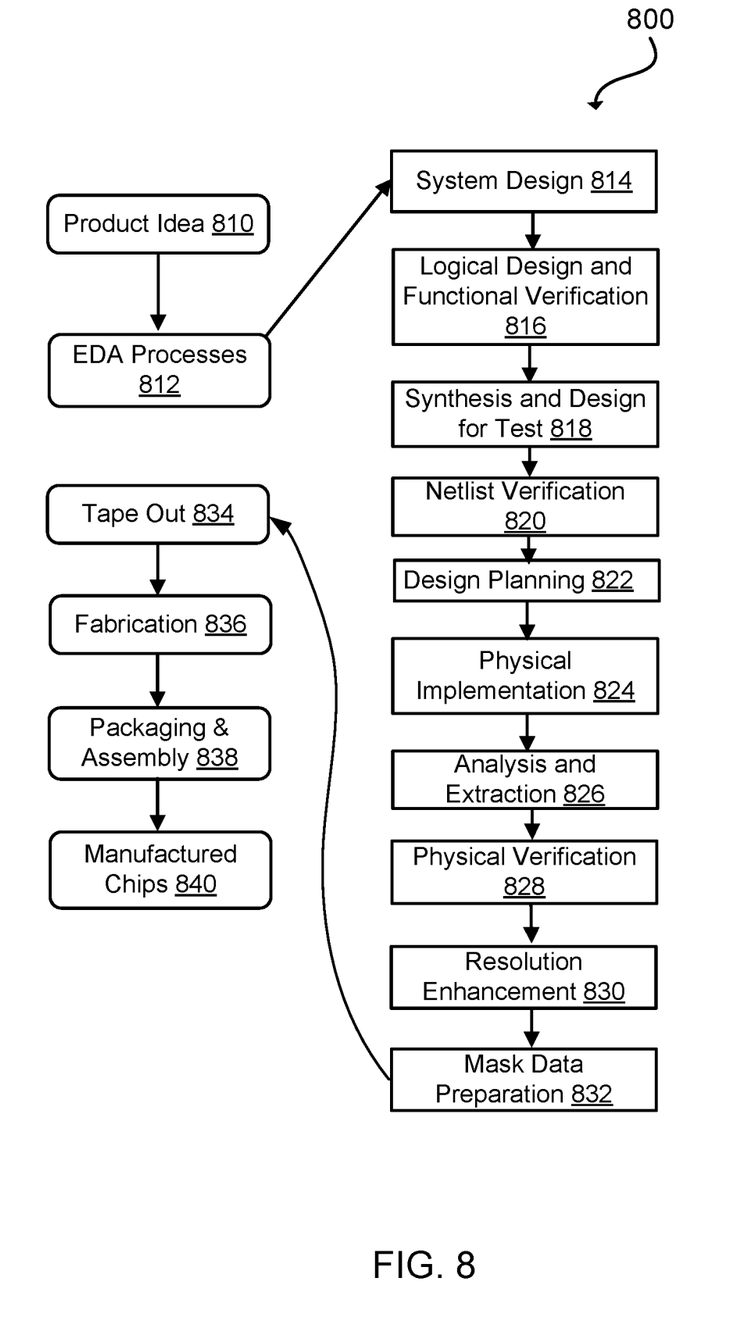
FIG. 8 is a flow diagram of various processes used during the design and manufacture of an integrated circuit. in accordance with some embodiments of the present disclosure.

FIG. 8 illustrates an example set of processes 800 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 810 with information supplied by a designer, information which is transformed to create an article of manufacture that uses a set of EDA processes 812. When the design is finalized, the design is taped-out 834, which is when artwork (e.g., geometric patterns) for the integrated circuit is sent to a fabrication facility to manufacture the mask set, which is then used to manufacture the integrated circuit. After tape-out, a semiconductor die is fabricated 836 and packaging and assembly processes 838 are performed to produce the finished integrated circuit 840.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 8. The processes described by be enabled by EDA products (or EDA systems).

During system design 814, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 816, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 818, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 820, the netlist is checked for compliance with timing constraints and for correspondence with the HDL code. During design planning 822, an overall floor plan for the integrated circuit is constructed and analyzed for timing and top-level routing.

During layout or physical implementation 824, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 826, the circuit function is verified at the layout level, which permits refinement of the layout design. During physical verification 828, the layout design is checked to ensure that manufacturing constraints are correct, such as DRC constraints, electrical constraints, lithographic constraints, and that circuitry function matches the HDL design specification. During resolution enhancement 830, the geometry of the layout is transformed to improve how the circuit design is manufactured.

During tape-out, data is created to be used (after lithographic enhancements are applied if appropriate) for production of lithography masks. During mask data preparation 832, the 'tape-out' data is used to produce lithography masks that are used to produce finished integrated circuits.

A storage subsystem of a computer system (such as computer system 900 of FIG. 9) may be used to store the programs and data structures that are used by some or all of the EDA products described herein, and products used for development of cells for the library and for physical and logical design that use the library.

Figure 9:
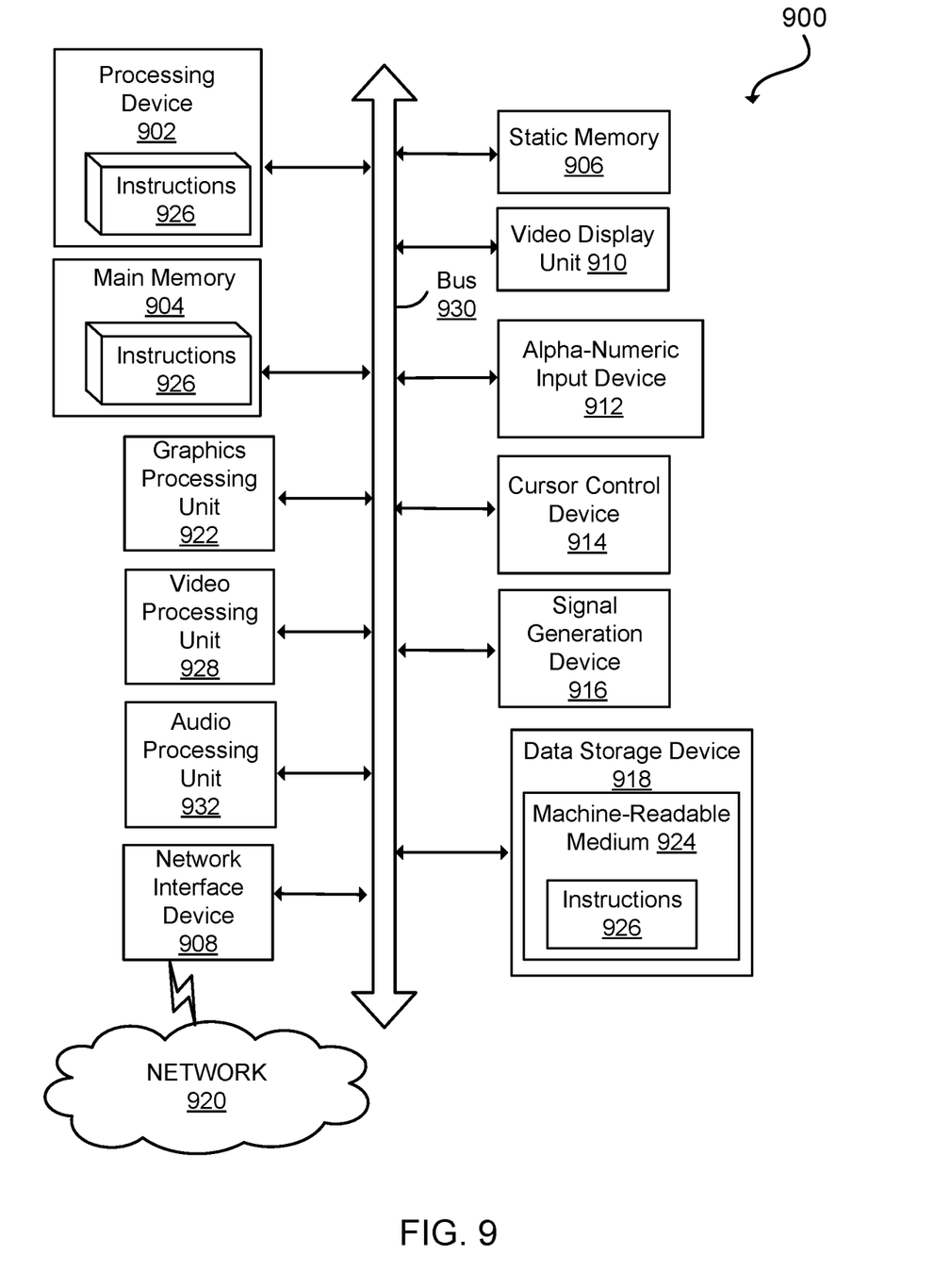
FIG. 9 is a diagram of an example computer system, in which embodiments of the present disclosure may operate.

FIG. 9 illustrates an example machine of a computer system 900 within which a set of instructions, for causing the machine to perform any one or more of the methodologies discussed herein, may be executed. In alternative implementations, the machine may be connected (e.g., networked)

to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
receiving a block-level design for a block of circuitry, the block containing at least one sub-block;
receiving sub-level test patterns for the sub-block, wherein the sub-level test patterns comprise (a) sub-level test stimuli applied to inputs of the sub-block (sub-block inputs), and (b) sub-level test responses expected at outputs of the sub-block (sub-block outputs) in response to the sub-level test stimuli;
receiving block-level test patterns that include (x) block-level test stimuli comprising the sub-level test stimuli ported to inputs of the block of circuitry (block inputs), and (y) block-level test responses comprising the sub-level test responses ported to outputs of the block of circuitry (block outputs); and
validating, by a processing device, the block-level test patterns, comprising:
computing propagation of the block-level test stimuli through the block-level design;
comparing signals produced by such computed propagation at the sub-block inputs against the sub-level test stimuli; and
comparing signals produced by such computed propagation at the block outputs against the block-level test responses.

2. The method of claim 1, wherein computing propagation of the block-level test stimuli through the sub-block comprises: for each sub-level test stimuli received at the sub-block inputs, forcing the corresponding sub-level test responses at the sub-block outputs, without using a netlist of the sub-block.

3. The method of claim 2, further comprising:
prior to validating the block-level test patterns, validating the sub-level test patterns.

4. The method of claim 2, wherein forcing the corresponding sub-level test responses at the sub-block outputs comprises:
using the received sub-level test stimuli to look up the corresponding sub-level test responses in a data structure that matches sub-level test stimuli with corresponding sub-level test responses.

5. The method of claim 2, wherein the block-level design is an RTL design.

6. The method of claim 1, wherein computing propagation of the block-level test stimuli through the sub-block comprises: computing propagation of the block-level test stimuli through the sub-block using a gate-level netlist of the sub-block.

7. The method of claim 1, wherein the block is a system-on-chip (SoC) integrated circuit, and the sub-block is a core contained in the SoC.

8. The method of claim 7, wherein the SoC contains a plurality of cores, and the method is executed separately for the plurality of cores as sub-blocks.

9. The method of claim 8, wherein the method is executed in parallel using different threads for different cores.

10. The method of claim 7, wherein the block-level test patterns are test patterns used by an automatic tester in testing manufactured SoCs.

11. The method of claim 7, further comprising:
porting the sub-level test stimuli to the block inputs, based on a behavioral model of intervening circuitry between the block inputs and the sub-block inputs; and
porting the sub-level test responses to the block outputs, based on a behavioral model of intervening circuitry between the sub-block outputs and the block inputs.

12. The method of claim 1, further comprising:
reporting faults in the block-level test patterns based on one or more of the comparisons.

13. A non-transitory computer readable medium comprising stored instructions, which when executed by a processing device, cause the processing device to:
receive a block-level design for a block of circuitry, the block containing at least one sub-block;
receive sub-level test stimuli for the sub-block, wherein the sub-level test stimuli are signals applied to inputs of the sub-block (sub-block inputs) as a part of functional tests for the sub-block;
receive block-level test stimuli comprising the sub-level test stimuli ported to inputs of the block of circuitry (block inputs); and
validate the block-level test stimuli, comprising:
computing propagation of the block-level test stimuli from the block inputs to the sub-block inputs using the block-level design; and
comparing the block-level test stimuli propagated to the sub-block inputs against the sub-level test stimuli.

14. The non-transitory computer readable medium of claim 13, wherein the block-level design is a gate-level netlist, and computing propagation of the block-level test stimuli from the block inputs to the sub-block inputs comprises a time-based simulation of the gate-level netlist.

15. The non-transitory computer readable medium of claim 13, wherein the stored instructions include a block-level testbench for the block of circuitry but do not include a sub-level testbench for the sub-block of circuitry.

16. The non-transitory computer readable medium of claim 13, wherein the block is a system-on-chip (SoC) integrated circuit, the sub-block is a core contained in the SoC, and the block-level test stimuli are test stimuli used by an automatic tester in testing manufactured SoCs.

17. A system comprising:
a memory storing instructions; and
a processing device, coupled with the memory and to execute the instructions, the instructions when executed cause the processing device to:
receive a block-level design for a block of circuitry, the block containing at least one sub-block;
receive sub-level test responses for the sub-block, wherein the sub-level test responses are signals expected at outputs of the sub-block (sub-block outputs) as a part of functional tests for the sub-block; and
force the sub-block outputs to the sub-level test responses.

18. The system of claim 17, wherein the instructions further cause the processing device to:
    receive block-level test responses comprising the sub-level test responses ported to outputs of the block of circuitry (block outputs); and
    validate the block-level test responses, comprising:
        computing propagation of the sub-level test responses from the sub-block outputs to the block outputs using the block-level design; and
        comparing the sub-level test responses propagated to the block outputs against the block-level test responses.

19. The system of claim 18, wherein the block-level design is a gate-level netlist, computing propagation of the sub-level test responses from the sub-block outputs to the block outputs comprises a time-based simulation of the gate-level netlist, and time stepping through the time-based simulation is controllable by a user.

20. The system of claim 18, wherein the block is a system-on-chip (SoC) integrated circuit, the sub-block is a core contained in the SoC, and the block-level test responses are test responses used by an automatic tester in testing manufactured SoCs.

\* \* \* \* \*